(12) United States Patent
Bao et al.

(10) Patent No.: US 6,322,736 B1
(45) Date of Patent: Nov. 27, 2001

(54) METHOD FOR FABRICATING MOLDED MICROSTRUCTURES ON SUBSTRATES

(75) Inventors: Zhenan Bao, North Plainfield; John A. Rogers, New Providence, both of NJ (US)

(73) Assignee: Agere Systems Inc., Orlando, FL (US)

( * ) Notice: Subject to any disclaimer, the term of this patent is extended or adjusted under 35 U.S.C. 154(b) by 0 days.

(21) Appl. No.: 09/393,032

(22) Filed: Sep. 9, 1999

Related U.S. Application Data

(62) Division of application No. 09/049,531, filed on Mar. 27, 1998, now Pat. No. 6,033,202.

(51) Int. Cl.$^7$ .............................. B29C 33/38; B29C 33/42
(52) U.S. Cl. ..................... 264/105; 264/251; 264/328.4; 264/337; 264/250
(58) Field of Search .................................. 264/250, 251, 264/254, 104, 105, 219, 225, 337, 338, 328.4, 328.5, 272.11; 425/116, 117, 120, 463, 464, 543, 544

(56) References Cited

U.S. PATENT DOCUMENTS

| | | | |
|---|---|---|---|
| 3,764,248 | * 10/1973 | Hall | 425/544 |
| 4,126,292 | * 11/1978 | Saeki et al. | 249/110 |
| 5,071,597 | * 12/1991 | D'Amato et al. | 264/219 |
| 5,256,360 | * 10/1993 | Li | 264/219 |
| 5,538,674 | * 7/1996 | Nisper et al. | 264/219 |
| 5,676,983 | * 10/1997 | Bacher et al. | 425/403 |
| 5,795,519 | * 8/1998 | Bacher et al. | 264/219 |
| 5,916,452 | * 6/1999 | Kobayashi et al. | 264/254 |

* cited by examiner

Primary Examiner—Angela Ortiz
(74) Attorney, Agent, or Firm—Lowenstein Sandler PC

(57) ABSTRACT

An improved elastomeric mold for use in fabricating microstructures, the mold having first and second surfaces, the first surface including at least one recessed microchannel and the second surface including an access opening or filling member that extends through the mold to the first surface and communicates with the recessed microchannel. The mold is used by placing it onto a substrate with the recessed microchannel facing the substrate. The access opening of the mold is filled with a liquid material which is capable of solidifying. The access opening continuously introduces the liquid material into the space defined between the microchannel and the substrate. After the liquid material solidifies, the mold is removed from the substrate thereby leaving a microstructure formed from the solidified liquid material on the substrate.

19 Claims, 9 Drawing Sheets

US 6,322,736 B1

METHOD FOR FABRICATING MOLDED MICROSTRUCTURES ON SUBSTRATES

CROSS REFERENCE TO RELATED APPLICATIONS

This application is a divisional of U.S. application Ser. No. 09/049,531 filed by the present applicants on Mar. 27, 1998, now U.S. Pat. No. 6,033,202.

FIELD OF THE INVENTION

This invention relates to non-photolithographic fabrication of microstructures, and in particular, to an improved mold for fabricating microstructures on one or more substrates using micromolding in capillaries (MIMIC). The mold is especially useful for fabricating plastic microelectronic devices.

BACKGROUND OF THE INVENTION

The demand for inexpensive microelectronic devices has resulted in the development of organic materials potentially useful in electronic and optoelectronic systems. This has led to advances in microelectronic devices that make it possible to inexpensively produce microelectronic devices that occupy large areas and are easily fabricated on rigid or flexible plastic supports. These advances include the development of conducting, semiconducting, and dielectric organic materials.

Unfortunately, present methods for patterning these organic materials are less than adequate. One such method is screen printing. See, Z. Bao, Y. Feng, A. Dodabalapur, V. R. Raju, A. J. Lovinger, "High-performance Plastic Transistors Fabricated by Printing Techniques," CHEM. MATER. 9 (1997) at 1299–1301. But the use of screen printing in making microelectronic devices such as FETs is limited by relatively poor resolution (~100 $\mu$m) of the screen printing method.

Another method which is capable of generating microstructures in a wide range of materials with feature sizes between one and several hundred microns is micromolding in capillaries (MIMIC). MIMIC involves forming capillary channels between a support and an elastomeric mold that contains recessed channels that emerge from the edges of the mold. A solution containing a solvent and a material (MIMIC solution) which forms the microstructure is applied to the channels at the edges of the mold. Once the solvent in the MIMIC solution evaporates, the mold is lifted from the substrate leaving a microstructure composed of the material. GaAs/AlGaAs heterostructure FETs with dimensions as small as ~20 $\mu$m have been fabricated using MIMIC defined sacrificial polymer layers. The MIMIC defined polymer layers were used in "lift-off" procedures to form the gates and the electrodes of the FETs.

The conventional MIMIC technique, however, has several serious disadvantages. First, the conventional molds used in MIMIC may only be filled by repeatedly applying the MIMIC solution to the recessed channels at the edges of the mold as the solvent in the solution evaporates. Second, when a conventional MIMIC mold is removed, excess unusable material remains on the substrate where the edges of the mold were located. This material must then be removed by cutting it away from the substrate. Third, the MIMIC solution may have to travel a greater distance in an edge filled MIMIC mold which leads to very long filling times. Fourth, patterns made from more than one type of material are not possible with conventional MIMIC molds. Fifth, MIMIC molds can not be easily integrated with conventional printing methods such ink jet printing or screen printing. Sixth, the MIMIC solution can not be forced or drawn into a conventional MIMIC mold with a pressure or a vacuum.

Accordingly, there is a need for an improved mold for use in MIMIC that overcomes the deficiencies of conventional MIMIC molds.

SUMMARY

In accordance with the present invention, an improved mold for use in fabricating microstructures comprises a body of elastomeric material having first and second surfaces, the first surface including at least one recessed microchannel and the second surface including at least one mold filling member that extends through the mold to the first surface and communicates with the recessed microchannel. The mold is used by placing it onto a substrate with the recessed microchannel facing the substrate. The mold filling member of the mold is filled with a liquid material capable of solidifying. The filling member continuously introduces the liquid material into the space defined between the microchannel and the substrate. After the liquid material solidifies, the mold is removed from the substrate thereby leaving a microstructure formed from the solidified liquid material on the substrate.

BRIEF DESCRIPTION OF THE DRAWINGS

The advantages, nature and various additional features of the invention will appear more fully upon consideration of the illustrative embodiments described in detail below, considered together with the accompanying drawings. In the drawings.

It should be understood that the drawings are for purposes of illustrating the concepts of the invention and are not to scale.

DETAILED DESCRIPTION

Figure 1:
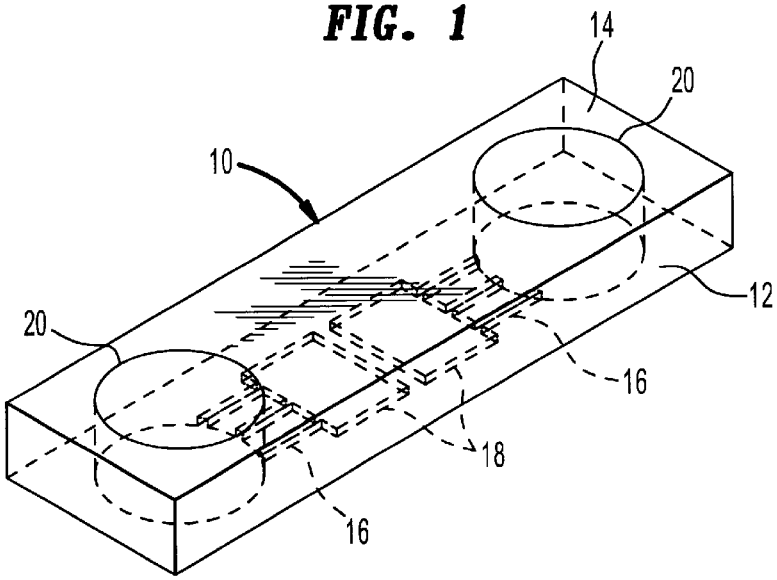
FIG. 1 is a perspective view of an elastomeric mold which may be used for micromolding in capillaries.

FIG. 1 shows an elastomeric mold 10 which may be used for micromolding in capillaries (MIMIC) to produce complex microstructures on one or more substrates. The mold 10 allows the microstructures to be fabricated from dilute solutions of organic material (MIMIC solutions). The mold 10 is especially useful for producing microstructures in MIMIC having dimensions substantially less than 100 μm.

The mold 10 includes a substrate contact surface 12 and a mold filling surface 14. Recessed microchannel and micromold cavity structures 16, 18 are defined in the contact surface 12 of the mold 10. Two access openings 20 extend through the mold 10 from the filling surface 14 to the contact surface 12. Each access opening 20 communicates with a corresponding set of microchannels 16. The recessed structures 16, 18 of the mold 10 may be shaped into simple and complex configurations according to the microstructure to be fabricated.

Figure 2A:
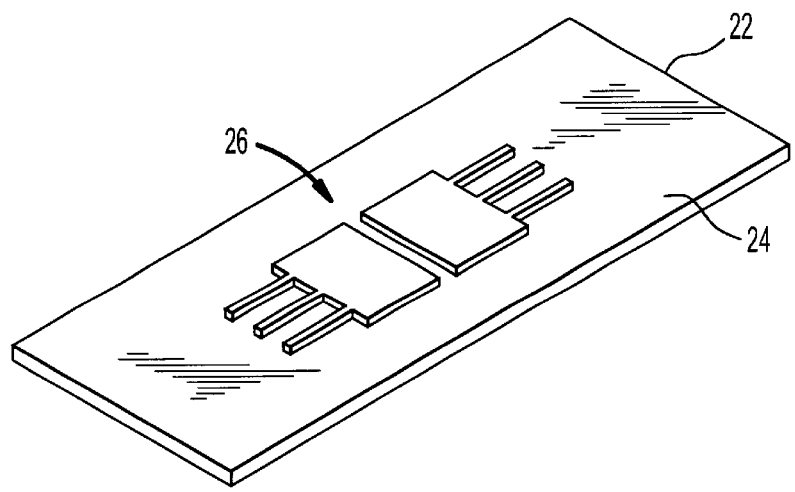
FIGS. 2A–2B illustrate the fabrication of the mold of FIG. 1.
Figure 2B:
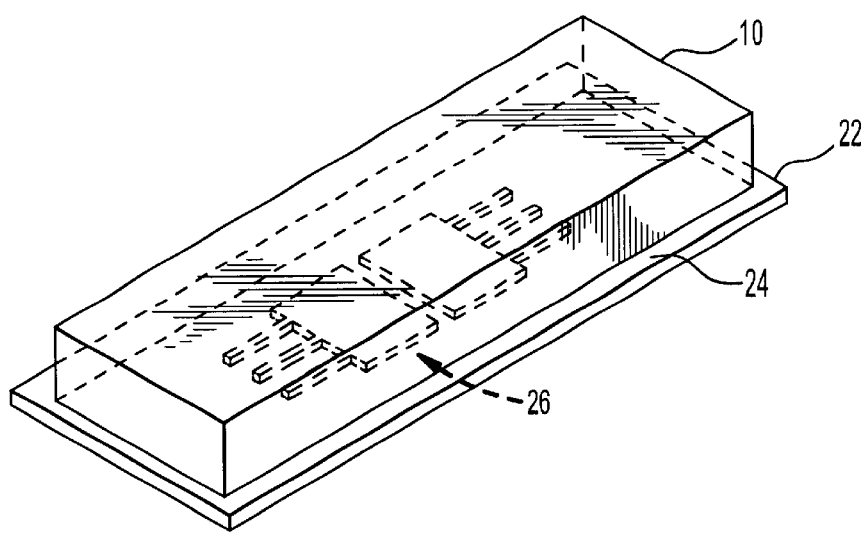

FIGS. 2A–2B illustrate the fabrication of the mold 10 of FIG. 1. FIG. 2A shows a master 22 which may be used for reproducing one or more copies of the mold 10. The master 22 comprises a rigid planar substrate 24 of $Si/SiO_2$, glass or metal with a raised pattern 26. The pattern 26 is substantially identical geometrically and dimensionally to the microstructures to be fabricated.

The raised pattern 26 may be fabricated on the substrate 24 from a photoresist material using an amplitude mask. Such photolithographic methods are capable of defining micrometer and submicrometer-scale photoresist patterns having complex structures. Accordingly, the pattern 26 may be easily generated with feature dimensions which are substantially less than 100 μm. For feature dimensions which are less than 0.5 μm, the raised pattern can be made using electron beam lithography to pattern a resist layer.

FIG. 2B shows the casting and curing of the mold 10 against the raised pattern 26 of the master 22 using known methods. See, D. Qin, Y. Xia, G. M. Whitesides, "Rapid Prototyping of Complex Structures with Feature Sizes Larger Than 20 μm," ADVANCED MATERIALS 8, No. 11 (1996) at 917–919 which is incorporated herein by reference. The mold 10 may be fabricated from an elastomer such as polydimethylsiloxane (PDMS). The compliant nature of PDMS allows conformal contact between the mold and the substrate which supports the micro structure. The low reactivity of PDMS allows the mold to easily separate from the microstructures.

After curing, the mold 10 is removed from the master 22 and the access openings 20 are machined. It is also possible to mold the access openings 20 into the mold during casting.

Figure 3:
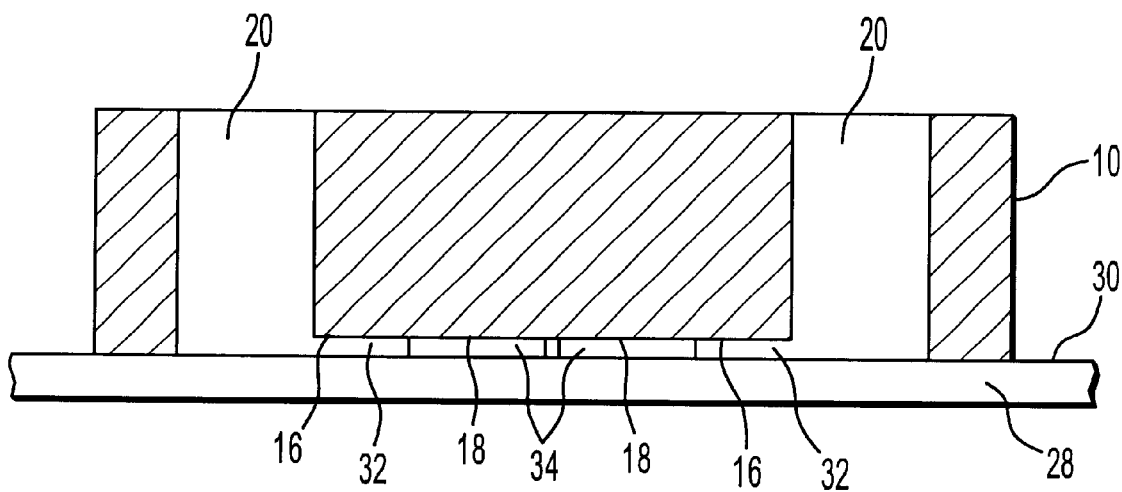
FIG. 3 is a cross-sectional side view showing the mold of FIG. 1 positioned on a microstructure support substrate.

FIG. 3 shows the mold 10 placed on a microstructure support substrate 28 with the recessed microchannel and micromold cavity structures 16, 18 facing the substrate 28. The compliant nature of the mold 10 allows the contact surface 12 to conform to the surface 30 of the substrate 28 producing a plurality of sealed capillary channels 32 which lead into two sealed micromold cavities 34. The access openings 20 are also sealed by the conformal contact between the surface 30 of the support substrate 28 and the contact surface 12 of the mold 10.

The sealed access openings 20 in the mold 10 provide an improved means for introducing MIMIC solutions into the micromold cavities 34 via the capillary channels 32. Dense, uniform solid microstructures may only be generated from the MIMIC solutions if the micromold cavities 34, via the capillary channels 32, are continuously supplied with the MIMIC solution as the solution cures by solvent evaporation or other means. This is accomplished with the mold 10 as each access opening 20 functions as a reservoir to maintain a continuous supply of MIMIC solution to a corresponding micromold cavity 34. Moreover, the access openings 20 allow the mold 10 to be filled using conventional automated printing equipment. For example, the access openings 20 can be automatically filled using an ink jet printer or a screen printer (not shown).

The access openings 20 also eliminate the need to cut away excess material (the material forming the microstructure) which typically remains on the microstructure support substrate when conventional molds without access openings are used. This is because removal of the mold 10 eliminates all material that does not reside in the capillary channels 32, the micromold cavities 34 and at the bottom of the access openings 20.

The access openings 20 of the mold 10 also enable the MIMIC solution to be applied adjacent the locations where the solution is required and enable the mold 10 to be made with separate micromold cavities 34 which produce separate microstructures. Since each micromold cavity 18 is supplied by its own access opening 20 and set of microchannels 16, each microstructure can be made from a different organic material if desired (using a different solution of organic material).

Figure 4:
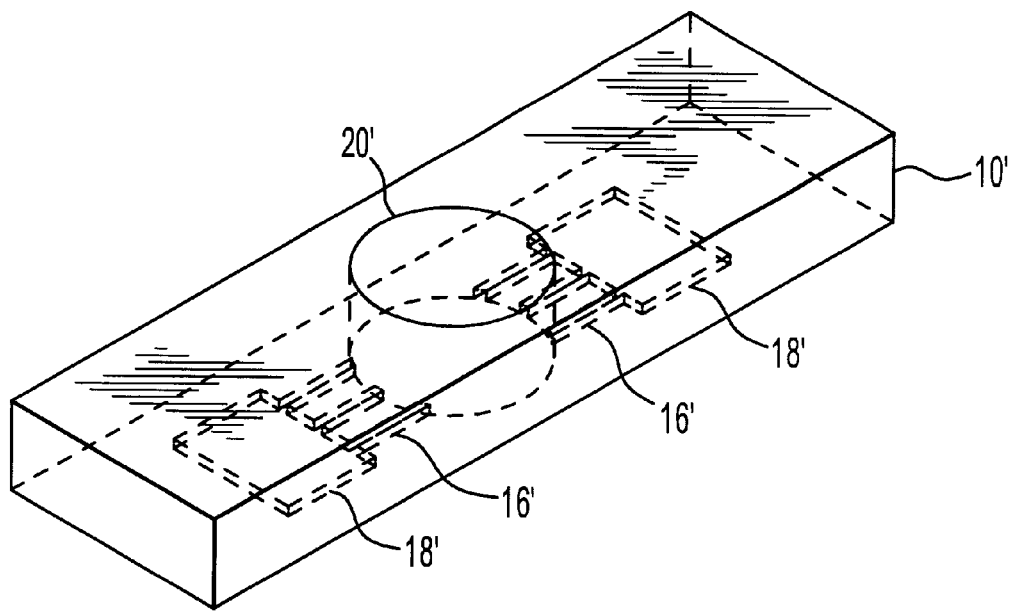
FIG. 4 is a perspective view of a mold according to a second embodiment of the invention.
Figure 5A:
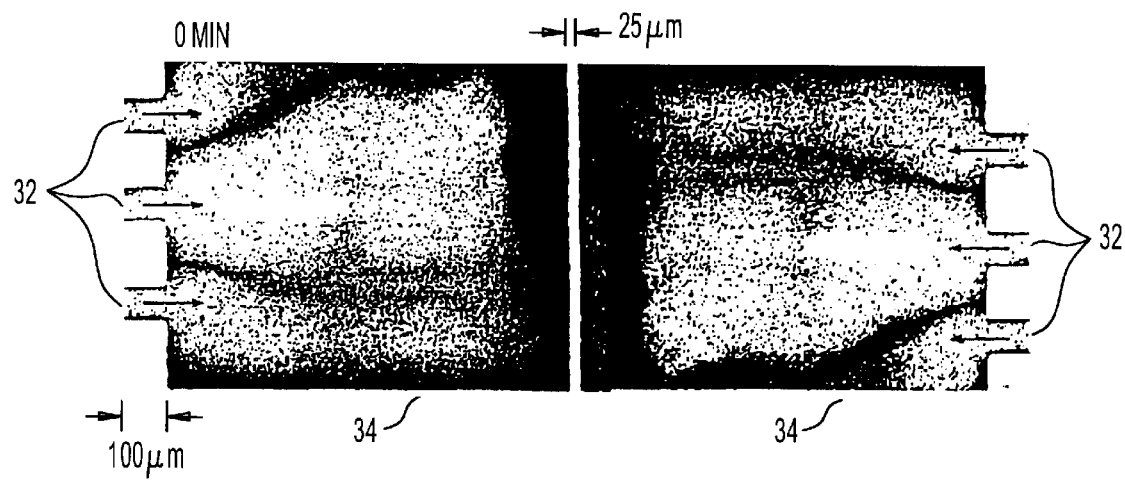
FIGS. 5A–5F are transmission mode optical micrographs collected at several times after capillary channels and the micromold cavities of the mold fill with carbon particles from a MIMIC solution of carbon in ethanol.
Figure 5B:
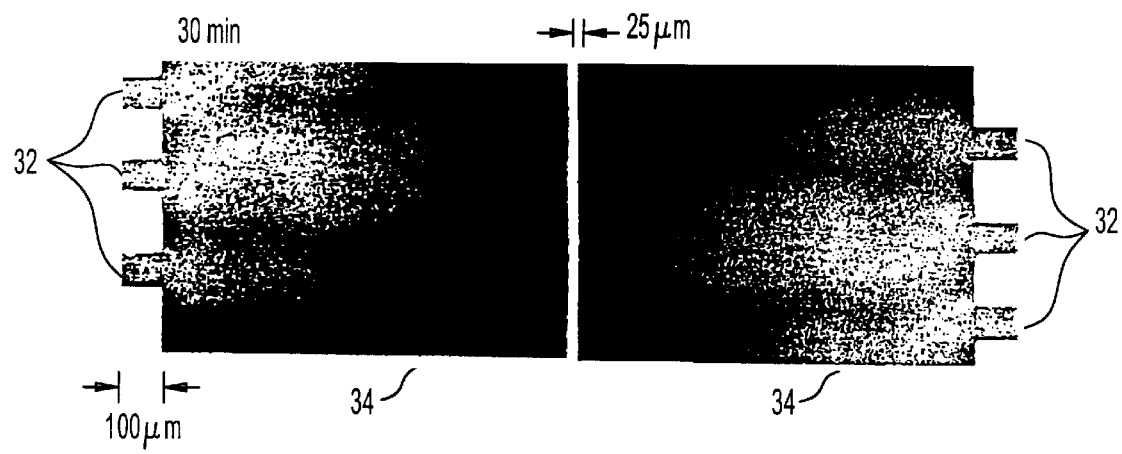
Figure 5C:
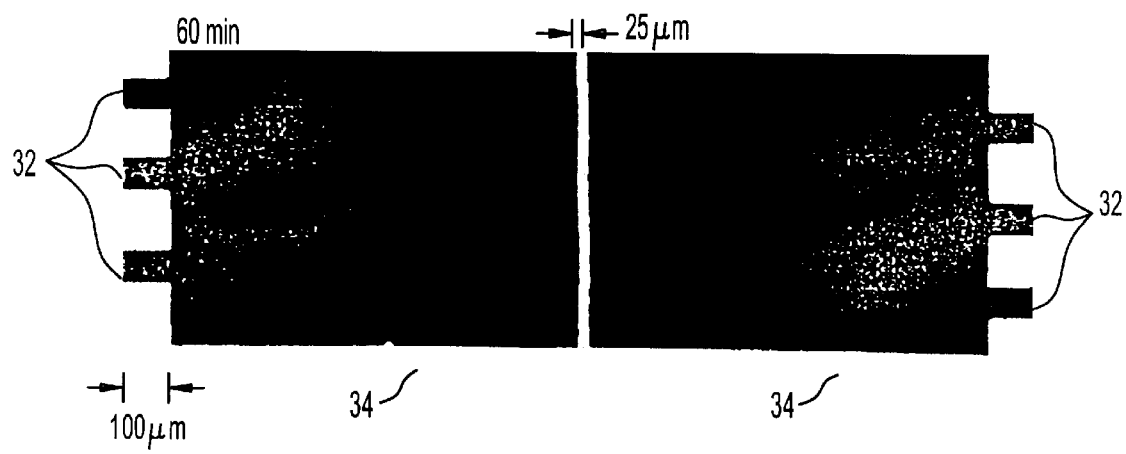
Figure 5D:
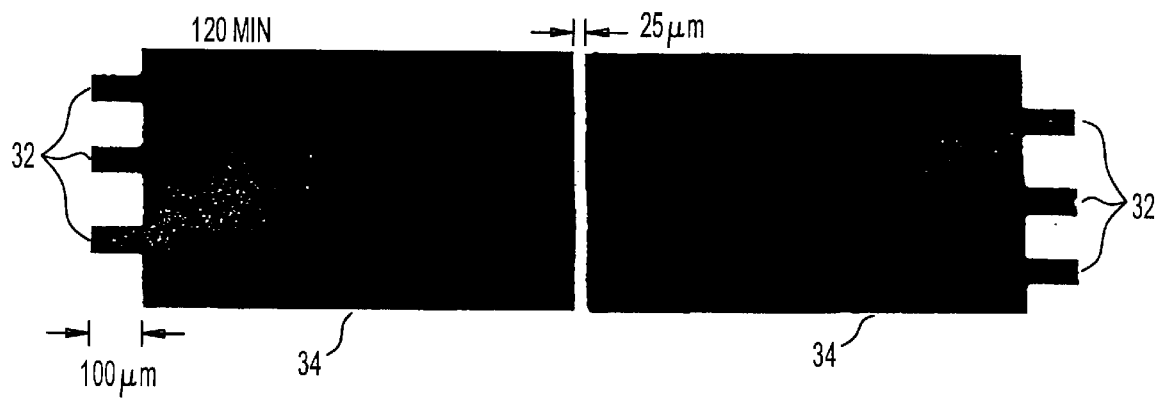
Figure 5E:
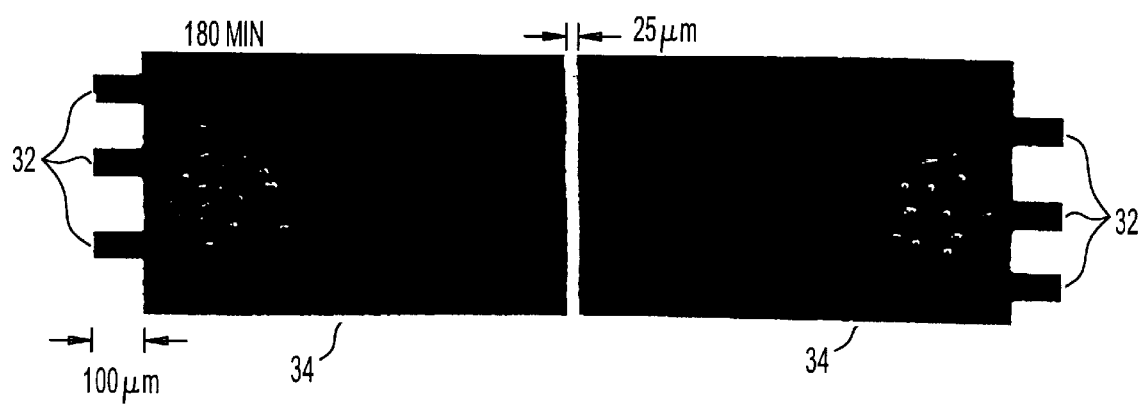
Figure 5F:
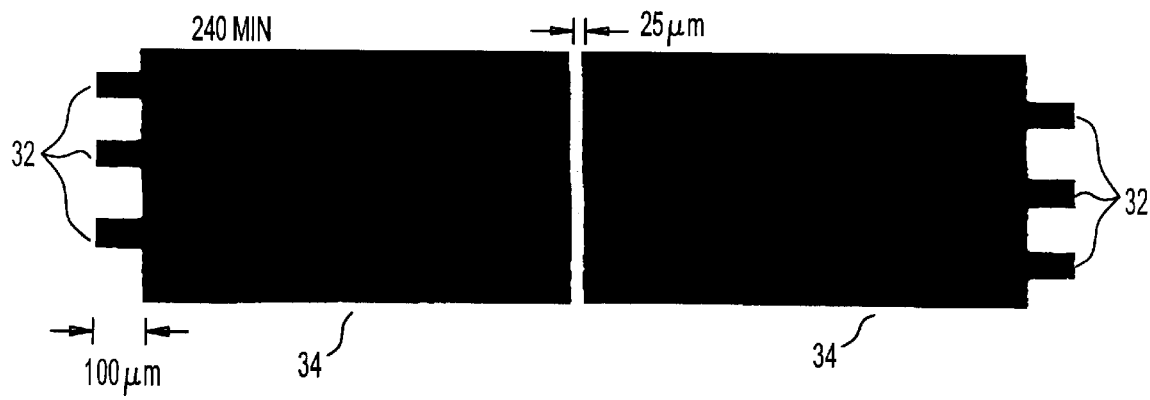

A single appropriately sized access opening may also be used for supplying one or more microcavities. FIG. 4 shows a mold 10' with a single access opening 20' that supplies two microchannel cavities 18' via two corresponding sets of microchannels 16'.

Figure 10:
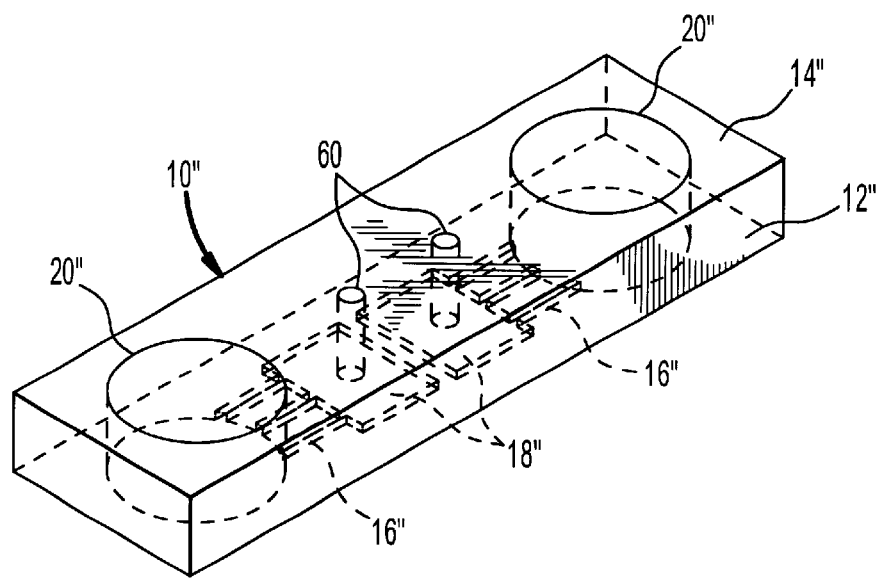
FIG. 10 is a perspective view of a mold according to a third embodiment of the invention.

Further reductions in mold filling times can be realized in the mold 10 by forcing or drawing the MIMIC solution into the mold. The MIMIC solution can be forced into the mold by pressurizing the access openings 20 of the mold 10 after filling them with MIMIC solution. The MIMIC solution can be drawn into the mold 10 by evacuating the micromold cavities. FIG. 10 shows a mold 10" having a vacuum port 60 which leads into each micromold cavity 34". A vacuum is applied to the vacuum ports 60 to evacuate the micromold cavities 34". This in turn draws the MIMIC solution into the mold 10 from the access openings 20".

FIGS. 5A–5F are transmission mode optical micrographs collected at several times after capillary channels and the micromold cavities of the mold 10 in contact with a transparent support, fill with carbon particles from a MIMIC solution of carbon in ethanol (about 2% solids). MIMIC solution flows through the two sets of three ~100 μm long capillary channels 32 that lead from corresponding access holes (not shown) to corresponding 1 mm by 1 mm micromold cavities 34. The flow stops at the edges of a ~25 μm gap. Evaporation of the ethanol through the elastomeric mold 10 (PDMS is permeable to ethanol vapor) drives the flow of the solution from the access openings to the micromold cavities 34. The time of fabrication can be reduced from about four (4) hours as indicated to about 30 minutes by increasing the solids content of the MIMIC solution.

Figure 6:
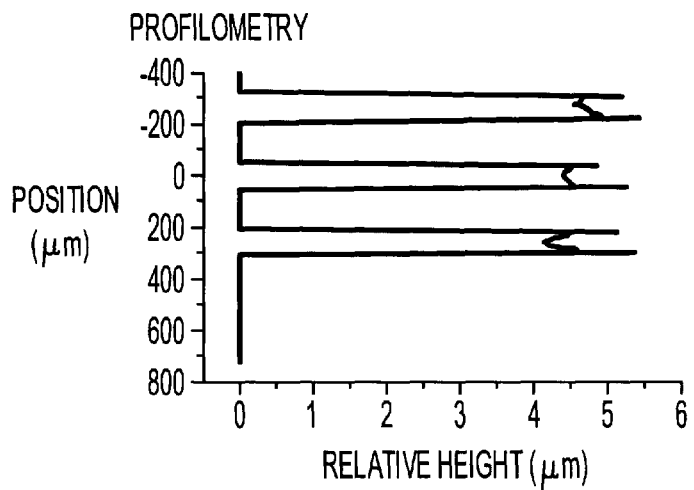
FIG. 6 is a profilometer trace collected from three wires formed by one set of the capillary channels.

FIG. 6 is a profilometer trace collected from three wires formed by one set of the capillary channels. The thickness of the carbon wires is slightly less (~5 μm) than the depth of the recessed microchannel in the mold 10 (~8 μm).

Figure 7A:
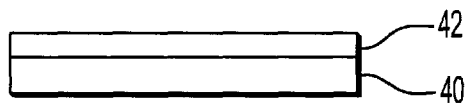
FIGS. 7A–7C are cross-sectional side views illustrating the fabrication of a plastic field-effect-transistor.

The mold 10 may be used in MIMIC to fabricate source and drain electrodes of a plastic field-effect-transistor (FET) from an organic material. The FET is first constructed using conventional screen printing processes. Fabrication begins in FIG. 7A, by providing a commercially available sheet 40 of poly(ethylene terephthalate) coated with a layer of indium-tin-oxide 42. The PET sheet forms a mechanically flexible supporting substrate for the FET. The thickness of the PET sheet 40 may be approximately 50 μm. The ITO layer 42 forms a gate electrode for the FET and may be approximately 0.1 μm thick. The FET may also be supported on a mechanically rigid substrate such as silicon having a thickness of approximately 3 mm.

Figure 7B:
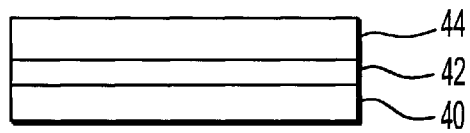

FIG. 7B shows a layer 44 of pre-imidized polyimide (PI) screen printed onto the ITO layer 42. The PI layer 44 forms a thin dielectric approximately less than 1 μm in thickness. Pre-imidized PI is commercially available from Japan Synthetic Rubber Co. under the tradename OPTIMER AL 3046. The dielectric layer 44 may also be formed by a 0.1 μm thick layer of silicon dioxide ($SiO_2$).

Figure 7C:
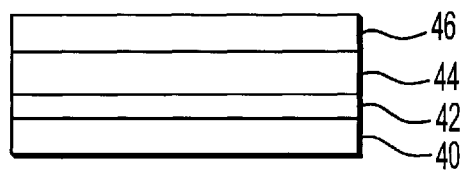

FIG. 7C shows a layer 46 of regioregular poly(3-hexylthiophene) (PHT) screen printed or casted onto the PI dielectric layer 44 using well known methods. See, Z. Bao, Y. Feng, A. Dodabalapur, V. R. Raju, A. J. Lovinger, "High-Performance Plastic Transistors Fabricated by Printing Techniques," CHEM. MATER. 9 (1997) at 1299–1301 which is incorporated herein by reference. The layer 46 of PHT has known semiconducting properties which makes it suitable for forming the channel region of the FET. See, Z. Bao, A. Dodabalapur, A. J. Lovinger, "Soluble and Processable Regioregular poly(3-hexylthiophene) for Thin Film Field-Effect Transistor Applications with High Mobility," Appl. Phys. Lett. 69 (1996), at 4108–4110 which is incorporated herein by reference. The thickness of the PHT layer 46 may be approximately 30–100 nm.

Figure 7D:
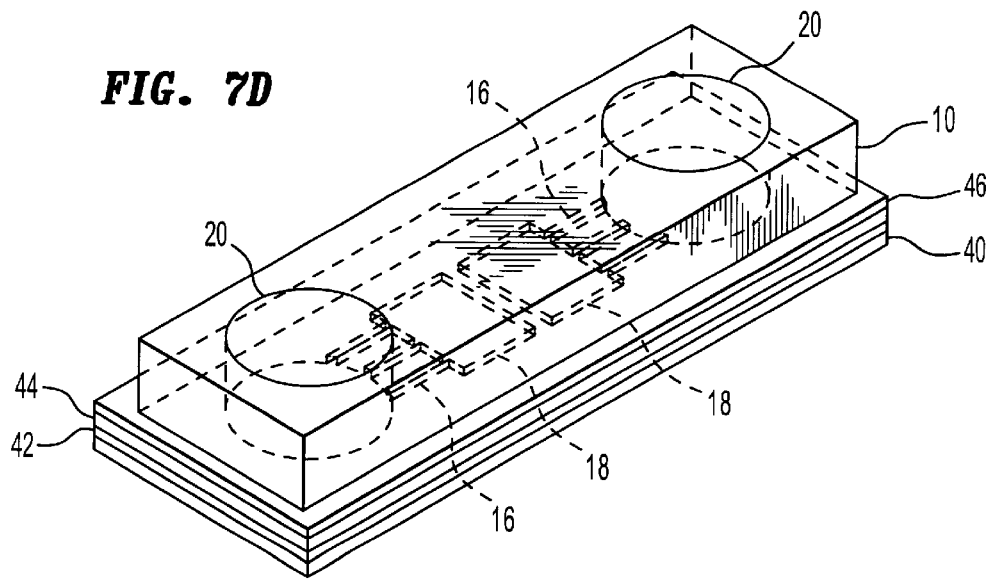
FIGS. 7D–7F are perspective views showing the use of the mold in MIMIC to fabricate source and drain electrodes for the plastic field-effect-transistor of FIG. 7C.

FIG. 7D shows the mold 10 of FIG. 1 placed onto the PHT layer 46 of the substrate 40 with the recessed microchannels 16 and micromold cavities 18 facing the PHT layer 46. The compliant nature of the mold 10 allows it to conformably contact the PHT layer 46 of the substrate 40. The mold 10 is located on the substrate so that micromold cavities 18 are disposed directly over the regions of the PHT layer 46 which form the source and drain regions of the FET.

Figure 7E:
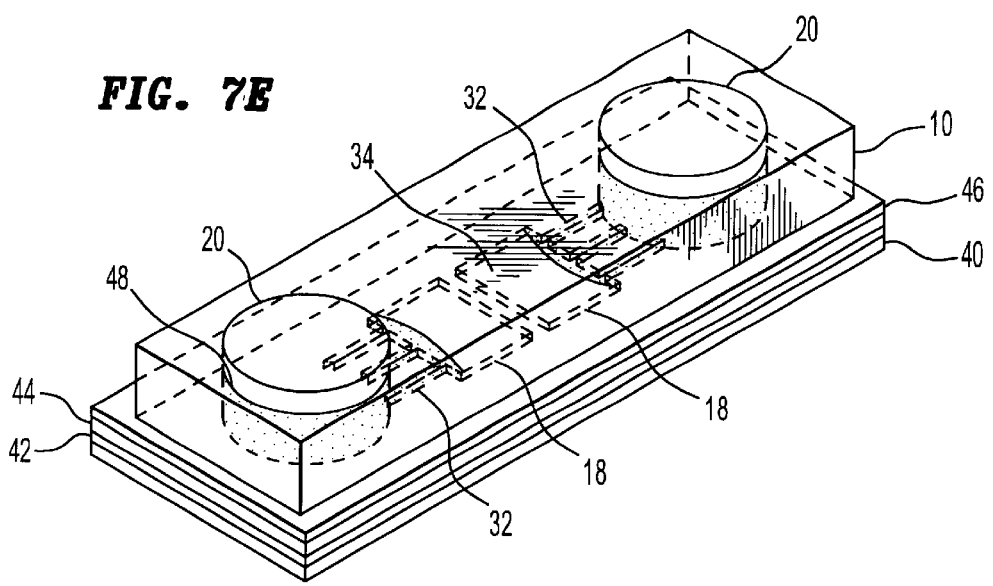

FIG. 7E shows the access openings 20 of the mold 10 filled with a MIMIC solution 48 containing an organic material. The MIMIC solution 48 preferably comprises a carbon paint made up of ethanol solvent and about 2% solid carbon. However, other colloidal suspensions of conductive colloidal particles and conducting polymer solutions may be used for the electrodes. For example, the MIMIC solution 48 may also comprise m-cresol solvent and conducting polyaniline (PA). An advantage of using a colloidal suspension of carbon for the electrodes is that the carbon particles do not tend to seep between the electrode patterns. Seepage between the electrodes could cause problems with the operation of the FET.

The MIMIC solution 48 stored in the openings 20 wicks into the capillary channels 32 and the micromold cavities 34 defined between the PHT layer 46 and the recessed structures 16, 18 of the mold 10. Evaporation of the solvent through the mold 10 from the filled capillary channels 32 and micromold cavities 34 forces the MIMIC solution 48 to flow from the access openings 20 into the capillary channels 32 and the micromold cavities 34. The filled access openings 20 of the mold 10 maintain a continuous supply of MIMIC solution 48 in the capillary channels 32 and the microcavities 34.

Figure 7F:
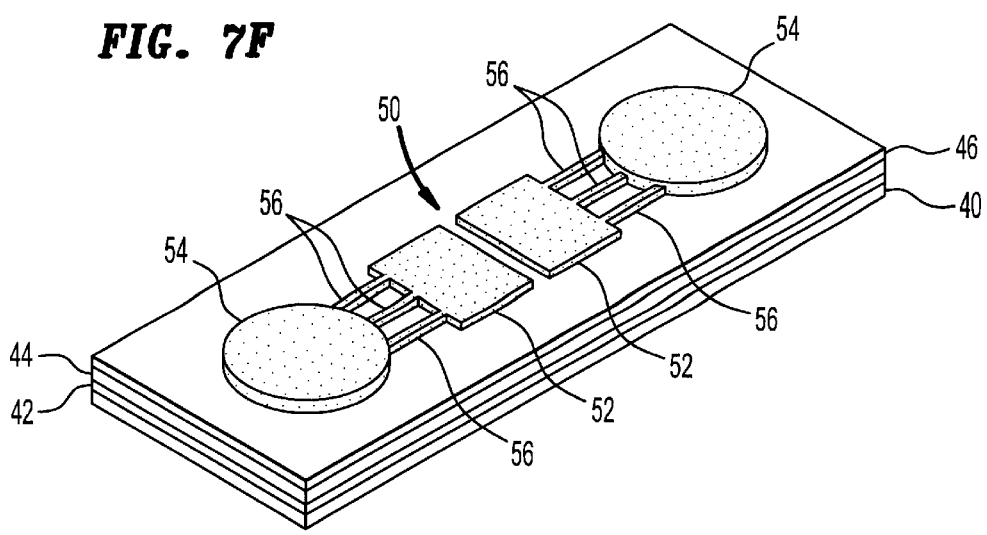

FIG. 7F shows the mold removed from the substrate 40. The mold leaves a pattern 50 of solid carbon on the layer 46 of PHT. The pattern 50 includes source and drain electrodes 52, contact pads 54, and wires 56 connecting the contact pads 54 to the electrodes 52.

Figure 8:
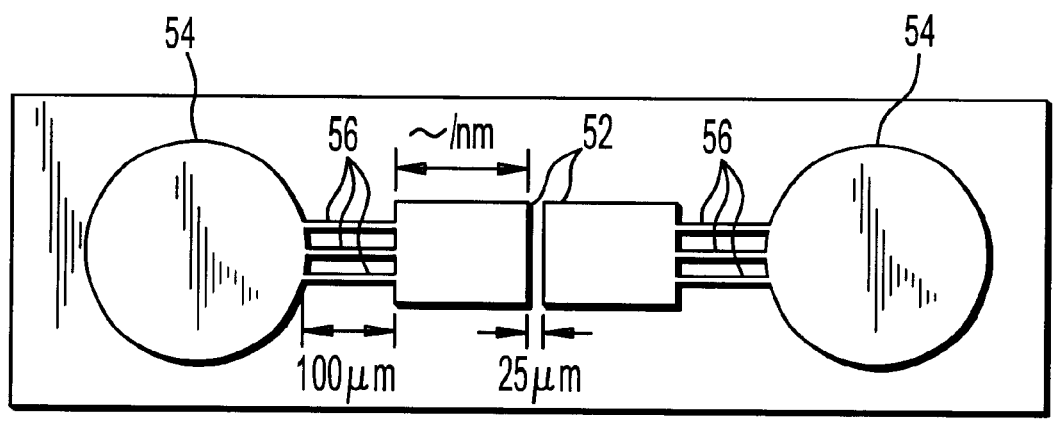
FIG. 8 shows a top plan view of the completed FET of FIG. 7F.

FIG. 8 shows a top plan view of the completed FET of FIG. 7F. The source and drain electrodes 52 consist of 1 mm by 1 mm squares separated by about 25 μm (defining a channel length of ~25 μm). The contact pads 54 each consist of a 2 mm diameter solid carbon circle. The wires 56 connecting the electrodes 52 to the contact pads 54 are each about 100 μm in length. The electrodes and wire structures 52, 56 of the pattern 50 are approximately 5 μm thick (mold feature depth was ~8 μm).

Figure 9A:
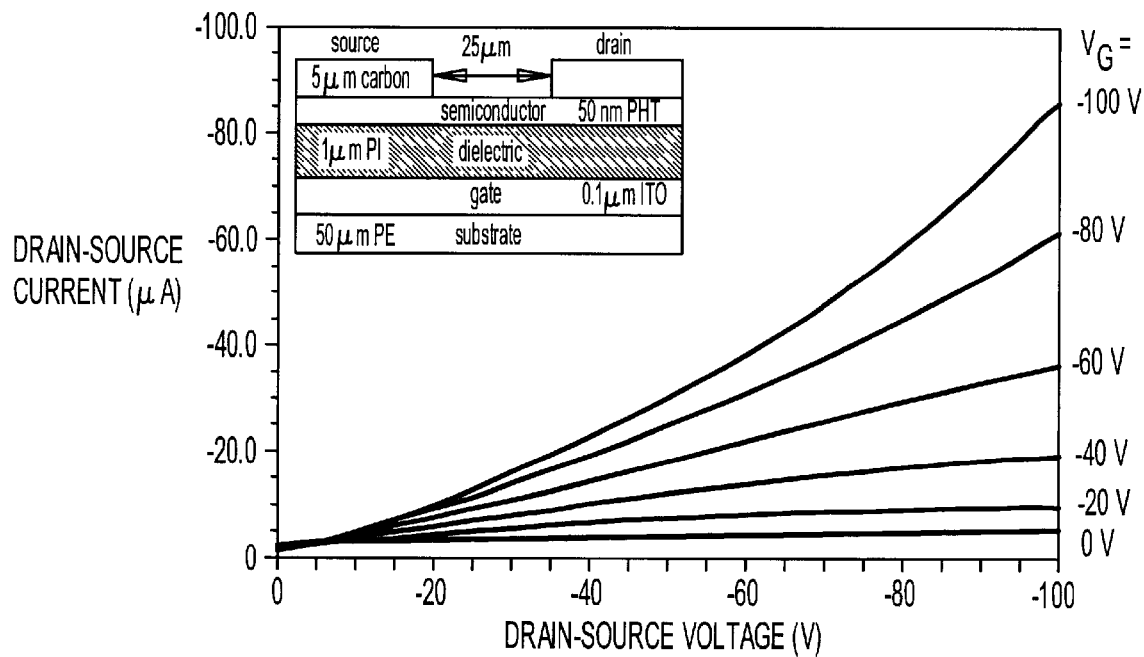
FIGS. 9A–9C are current-voltage curves from plastic FETs made using the mold of the present invention in MIMIC.
Figure 9B:
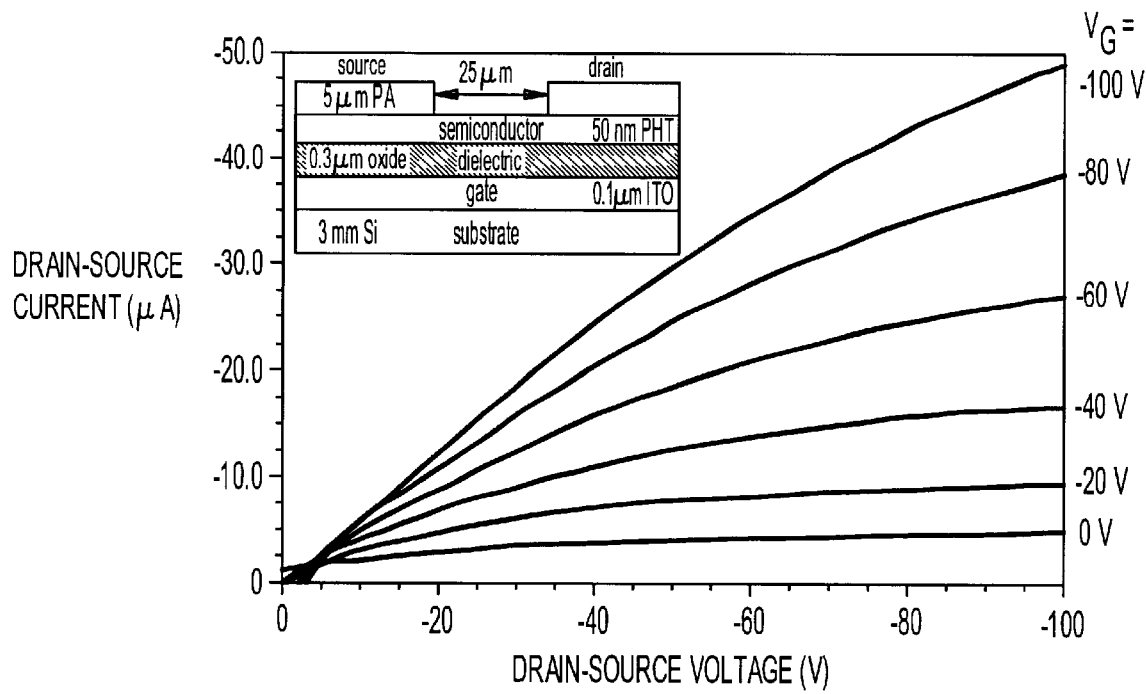
Figure 9C:
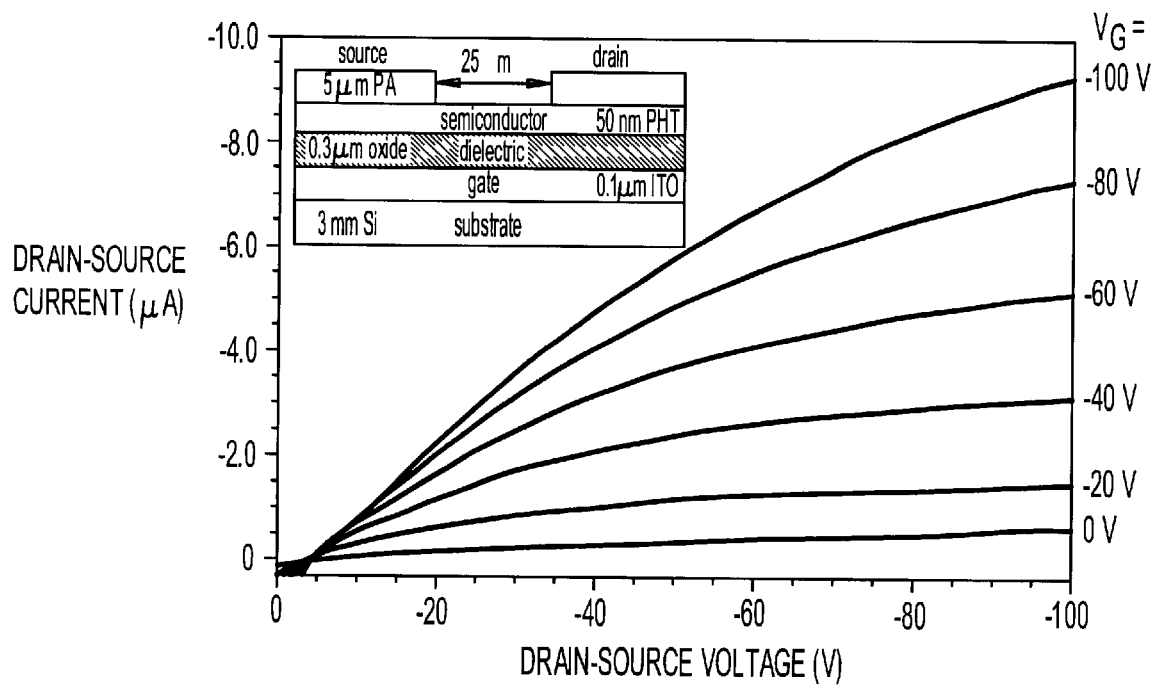

FIGS. 9A–9C are current-voltage curves from plastic FETs made using the mold of the present invention in MIMIC. The scaling of negative drain-source current with negative gate voltages indicates p-channel transistors. The field-effect mobilities of these transistors are in the order of 0.01 to 0.05 $cm^2/Vs$. These characteristics are consistent with those of larger transistors fabricated using screen printing and conventional photolithographic methods and PHT semiconducting material.

FIG. 9A shows current-voltage curves of a FET with ~5 μm thick conducting carbon electrodes, a ~50 nm thick semiconducting PHT layer, a screen-printed ~1 μm thick PI layer, and an ITO-coated ~50 μm thick PET substrate. The FET had a channel width of about 2.5 mm, and a channel length of about 25 μm.

FIG. 9B shows current-voltage curves of a FET with ~5 μm thick conducting carbon electrodes, ~50 nm thick semiconducting PHT layer, a ~0.3 μm thick $SiO_2$ layer, and an ITO-coated ~3 mm thick Si substrate. The FET had a channel width of about 2.5 mm, and a channel length of about 25 μm.

FIG. 9C shows current-voltage curves of a FET with ~5 μm thick doped PA electrodes, a ~50 nm thick semiconducting PHT layer, a ~0.3 μm thick $SiO_2$ layer, and an ITO-coated ~3 mm thick Si substrate. The FET had a channel width of about 1.0 mm, and a channel length of about 50 μm.

The mold of the present invention is capable of producing features as small as 1 μm in MIMIC. The mold can be used with a broad range of materials and when used in MIMIC requires minimal or no access to clean room facilities.

It should be understood that the above described embodiments are illustrative of only a few of the many possible specific embodiments which can represent applications of the principles of the invention. For example, each access opening in the mold can be replaced by a filling member such as a syringe inserted through the mold which communicates with a corresponding micromold cavity. The syringe can be filled with MIMIC solution which is injected directly into the micromold cavity. This and other varied arrangements can be devised by those skilled in the art without departing from the spirit and scope of the invention.

What is claimed is:

1. A method for fabricating a microstructure, the method comprising the steps of:

(a) providing a substrate for supporting the microstructure;

(b) providing an elastomeric mold having first and second surfaces, the first surface including at least one recessed microchannel and the second surface including a mold filling member that extends through the mold to the first surface and communicates with the recessed microchannel;

(c) placing the mold onto the substrate with the recessed microchannel facing the substrate;

(d) filling the mold filling member of the mold with a liquid material which is capable of solidifying, the filling member continuously introducing the liquid material into the microchannel; and (e) removing the mold from the substrate after the liquid material solidifies thereby leaving a microstructure formed from the solidified liquid material on the substrate, the microstructure having a shape and dimensions defined by the microchannel.

2. The method according to claim 1, wherein the substrate in step (a) includes a plurality of microstructures.

3. The method according to claim 2, wherein the plurality of microstructures are elements of a microelectronic device.

4. The method according to claim 1, wherein the minimum dimension of the microstructure is substantially less than 100 $\mu$m.

5. The method according to claim 1, wherein the minimum dimension of the microstructure is approximately 0.05 $\mu$m.

6. The method according to claim 1, wherein the mold is made from polydimethylsiloxane.

7. The method according to claim 1, wherein the mold filling member comprises a syringe that extends through the mold to the first surface and communicates with the recessed microchannel.

8. The method according to claim 1, wherein the mold filling member comprises an access opening that extends through the mold to the first surface and communicates with the recessed microchannel.

9. The method according to claim 1, wherein the first surface of the mold includes a recessed microcavity, the microchannel communicating with the filling member and the recessed microcavity, the microstructure formed from the solidified liquid material on the substrate having a shape and dimensions defined by the microchannel and the microcavity.

10. The method according to claim 1, wherein the first surface of the mold includes at least a second microchannel communicating with the filling member, the mold filling member continuously introducing the liquid material into the second microchannel during the filling step, whereby a second microstructure formed from the material remains on the substrate after the mold removal step, the second microstructure having a shape and dimensions defined by the second microchannel.

11. The method according to claim 1, wherein the first surface of the mold includes at least a second microchannel and the second surface of the mold includes at least a second mold filling member that extends through the mold to the first surface and communicates with the second microchannel, the filling step including filling the second mold filling member with the liquid material, the second mold filling member continuously introducing the liquid material into the second microchannel whereby a second microstructure formed from the solidified liquid material remains on the substrate after the mold removal step, the second microstructure having a shape and dimensions defined by the second microchannel.

12. The method according to claim 1, wherein the first surface of the mold includes at least a second microchannel, and the second surface of the mold includes at least a second mold filling member the extends through the mold to the first surface and communicates with the second microchannel, the filling step including the step of filling the second mold filling member with a second different liquid material which is capable of solidifying, the second mold filling member continuously introducing the second liquid material into the second microchannel whereby a second microstructure formed from the solidified second liquid material remains on the substrate after the mold removal step, the second microstructure having a shape and dimensions defined by the second microchannel.

13. The method according to claim 1, further comprising the step of providing at least a second substrate and using the mold provided in step (b) to perform steps (c)–(e) on the second substrate to produce a microstructure on the second substrate.

14. The method according to claim 1, wherein the filling step includes the step of pressurizing the solution contained within the mold filling member.

15. The method according to claim 1, wherein the filling step includes the step of applying a vacuum to the recessed microchannel to draw the solution from the mold filling member into the microchannel.

16. The method according to claim 1, wherein the filling step is performed with an automatic filling device.

17. The method according to claim 16, wherein the automatic filling device includes one of a screen printer and ink jet printer.

18. The method according to claim 1, wherein the material in the liquid material comprises a colloidal suspension of electrically conductive particles.

19. The method according to claim 1, wherein the material in the liquid material comprises a conductive polymer.

* * * * *

UNITED STATES PATENT AND TRADEMARK OFFICE
CERTIFICATE OF CORRECTION

PATENT NO.   : 6,322,736 B1
DATED        : November 27, 2001
INVENTOR(S)  : Zhenan Bao and John A. Rogers It is certified that error appears in the above-identified patent and that said Letters Patent is hereby corrected as shown below:

Column 7,
Line 11, should read: 5. The method according to claim 1, wherein the minimum dimension of the microstructure is approximately 0.5 $\mu$m Signed and Sealed this Ninth Day of September, 2003

JAMES E. ROGAN
*Director of the United States Patent and Trademark Office*